(12) United States Patent
Xu

(10) Patent No.: US 6,933,516 B2
(45) Date of Patent: Aug. 23, 2005

(54) FORMING TAPERED LOWER ELECTRODE PHASE-CHANGE MEMORIES

(75) Inventor: Daniel Xu, Mountain View, CA (US)

(73) Assignee: Ovonyx, Inc., Boise, ID (US)

( * ) Notice: Subject to any disclaimer, the term of this patent is extended or adjusted under 35 U.S.C. 154(b) by 8 days.

(21) Appl. No.: 10/839,499

(22) Filed: May 5, 2004

(65) Prior Publication Data

US 2004/0209478 A1 Oct. 21, 2004

Related U.S. Application Data

(62) Division of application No. 09/975,163, filed on Oct. 11, 2001, now Pat. No. 6,800,563.

(51) Int. Cl.[7] .............................................. H01L 47/00
(52) U.S. Cl. ........................................................ 257/4
(58) Field of Search ............................. 257/3–5, 9, 20, 257/21, 27, E31.026, E31.027, E31.029, E45.002, E29.233, 57; 438/40–46, 689, 718, 719, 978, FOR 458, FOR 439, FOR 212

(56) References Cited

U.S. PATENT DOCUMENTS

| | | | | |
|---|---|---|---|---|
| 4,085,498 A | * | 4/1978 | Rideout | 438/241 |
| 4,474,623 A | * | 10/1984 | Adlerstein | 438/412 |
| 4,599,705 A | * | 7/1986 | Holmberg et al. | 365/163 |
| 4,845,533 A | * | 7/1989 | Pryor et al. | 257/4 |
| 6,014,400 A | * | 1/2000 | Kobayashi | 372/96 |
| 6,150,253 A | * | 11/2000 | Doan et al. | 438/597 |
| 6,407,004 B1 | * | 6/2002 | Kimura et al. | 438/720 |

\* cited by examiner

*Primary Examiner*—George Fourson
*Assistant Examiner*—Brook Kebede
(74) *Attorney, Agent, or Firm*—Trop, Pruner & Hu, P.C.

(57) ABSTRACT

A phase-change memory may have a tapered lower electrode coated with an insulator. The coated, tapered electrode acts as a mask for a self-aligned trench etch to electrically separate adjacent wordlines. In some embodiments, the tapered lower electrode may be formed over a plurality of doped regions, and isotropic etching may be used to taper the electrode as well as part of the underlying doped regions.

10 Claims, 5 Drawing Sheets

FORMING TAPERED LOWER ELECTRODE PHASE-CHANGE MEMORIES

This is a divisional of prior Application Ser. No. 09/975,163, filed Oct. 11, 2001 now U.S. Pat. No. 6,800,563.

BACKGROUND

This invention relates generally to memories that use phase-change materials.

Phase-change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure and the crystalline state involves a more ordered atomic structure. Generally, any phase-change material may be utilized; however, in some embodiments, thin-film chalcogenide alloy materials may be particularly suitable.

The phase-change may be induced reversibly. Therefore, the memory may change from the amorphous to the crystalline state and may revert back to the amorphous state thereafter or vice versa. In effect, each memory cell may be thought of as a programmable resistor, which reversibly changes between higher and lower resistance states in response to temperature changes. The temperature changes may be induced by resistive heating.

In some situations, the cell may have a large number of states. That is, because each state may be distinguished by its resistance, a number of resistance-determined states may be possible, allowing the storage of multiple bits of data in a single cell.

A variety of phase-change alloys are known. Generally, chalcogenide alloys contain one or more elements from column VI of the periodic table. One particularly suitable group of alloys are GeSbTe alloys.

In any memory, it is desirable to pack the individual memory cells as closely as possible. With conventional phase-change memory materials, there is no real way to self-align the trenches that separate adjacent rows of memory cells from one another. Therefore, critical alignment processing may be necessary to accurately space one wordline from the next. Moreover, extra real estate may be needed between adjacent wordlines to make up for any misalignment between the trenches and the adjacent memory cells.

Thus, there is a need for better ways to form trenches for phase-change memories.

DETAILED DESCRIPTION

Figure 1:
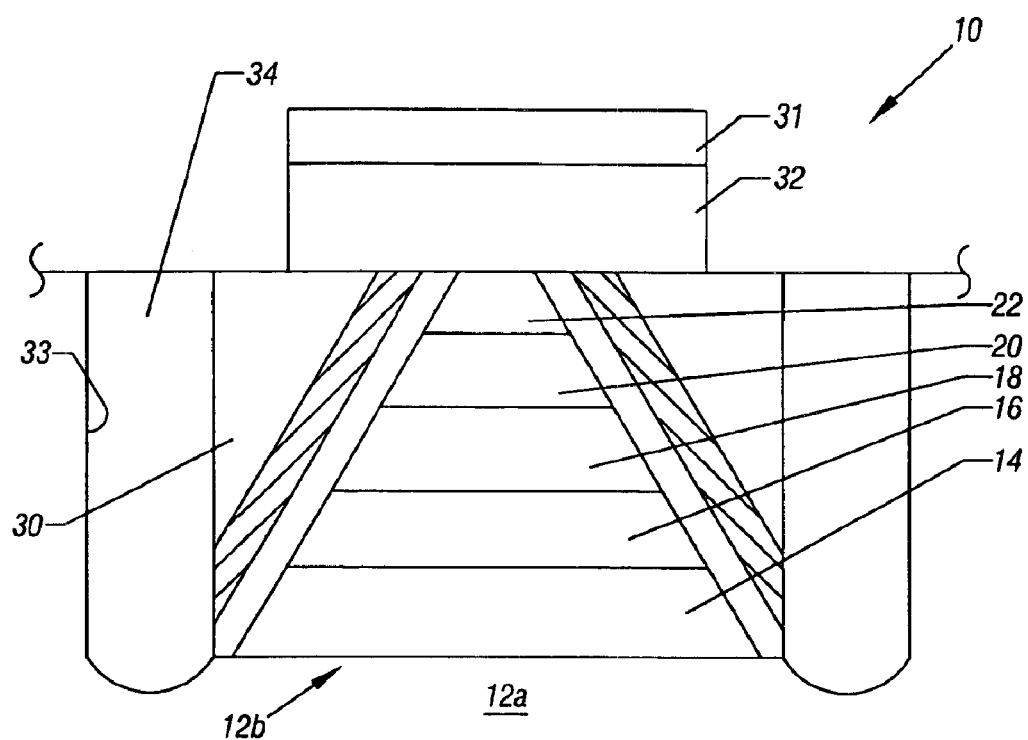
FIG. 1 is an enlarged cross-sectional view in accordance with one embodiment of the present invention.

Referring to FIG. 1, in one embodiment of the invention, a memory cell 10 may include a suitable phase change material 32 disposed between a tapered lower electrode 22 and an upper electrode 31. One suitable type of phase change material may be an alloy that includes at least one chalcogen element, and a transition element among others. Examples of such alloys are alloys of Germanium, Antimony and Tellerium.

The lower electrode 22 may be formed over a substrate 12. The substrate 12 may include a lower substrate portion 12a of a first conductivity type that, in one embodiment of the present invention, may be a P− material. A conical substrate portion 12b may extend upwardly from the lower portion 12a to the lower electrode 22. The conical substrate portion 12b may include a plurality of layers 14–20.

In one embodiment, the layers 14, 16, and 18 may be of a second conductivity type opposite to the first conductivity type. For example, the layer 14 may be an N− layer, the layer 16 may be an N+ layer, and the layer 18 may be an N− layer, in accordance with one embodiment of the present invention. Together the layers 14, 16, and 18 may form a buried wordline, in one embodiment of the present invention.

Over the layers 14, 16, and 18, may be a layer 20 of the first conductivity type, which, in one embodiment of the present invention, may be a P+ layer. The juxtaposition of the layers 14, 16, and 18 of a second conductivity type below the layer 20 of a first conductivity type may form a diode.

The tapered shape of the lower electrode 22 reduces the contact area between the electrode 22 and the phase-change material 32. This increases the resistance at the point of contact, increasing the ability of the electrode 22 to heat the layer 32. In some embodiments, the lower electrode 22 may be made of cobalt silicide and may be covered by interfacial layers.

The conical substrate portion 12b may be covered with a suitable dielectric 30 such as silicon dioxide. Further, each wordline may be electrically isolated from two adjacent wordlines by trenches 33 that may be filled with insulator 34 such as silicon dioxide.

The sidewalls of the conical substrate portion 12b may be covered with dielectric layers 26 and 28. In some embodiments the layer 26 may be silicon dioxide and the layer 28 may be silicon nitride. The layers 26 and 28 may aid in the formation of the trenches 33.

The upper electrode 31 may be made of any suitable electrical conductor. In some embodiments the electrode 31 may be covered by barrier or adhesion layers.

Figure 2:
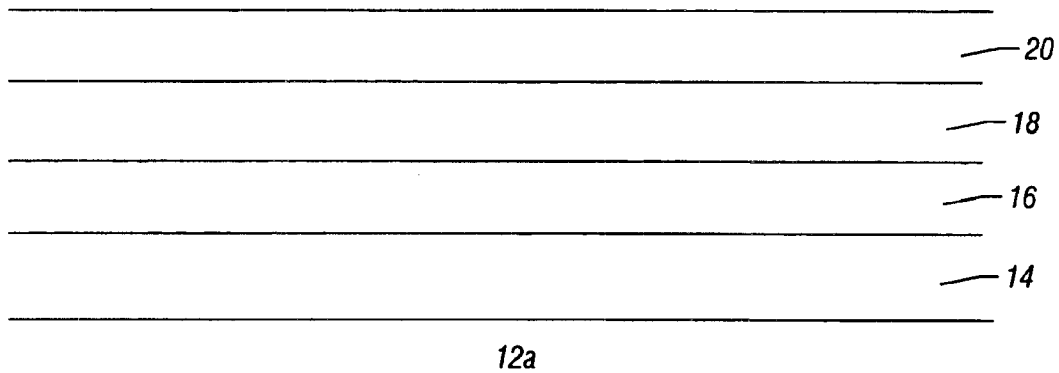
FIG. 2 is an enlarged cross-sectional view of the structure described in FIG. 1 at an early stage fabrication, in accordance with one embodiment of the present invention.

Turning next to FIG. 2, the formation of the memory cell 10 may begin with the formation of the layers 14–20. The substrate 12 may be subjected to a sequence of ion implantation steps. The energy, dose, and angle of ion beams of a series of implants may be selected to achieve the doping profile of the layers 14, 16, 18 and 20 shown in FIG. 2.

While the exact nature of the ion implantation steps may be subject to considerable variation, an initial implantation may be utilized to form a P-type well. This may be followed by P type and N type implants to form the layers 14–20. These implants in turn may be followed by one or more additional implants, in some embodiments, to create the profiles indicated in FIG. 2. In some embodiments, P type regions may be formed by a boron implant and N type regions may be formed by a phosphorus implant.

The same implantation process may simultaneously be used to define structures in a large number of surrounding memory cells (not shown) also formed in the substrate 10. This implantation process may be done in a blanket fashion without masking between cells, in some embodiments.

Figure 3:
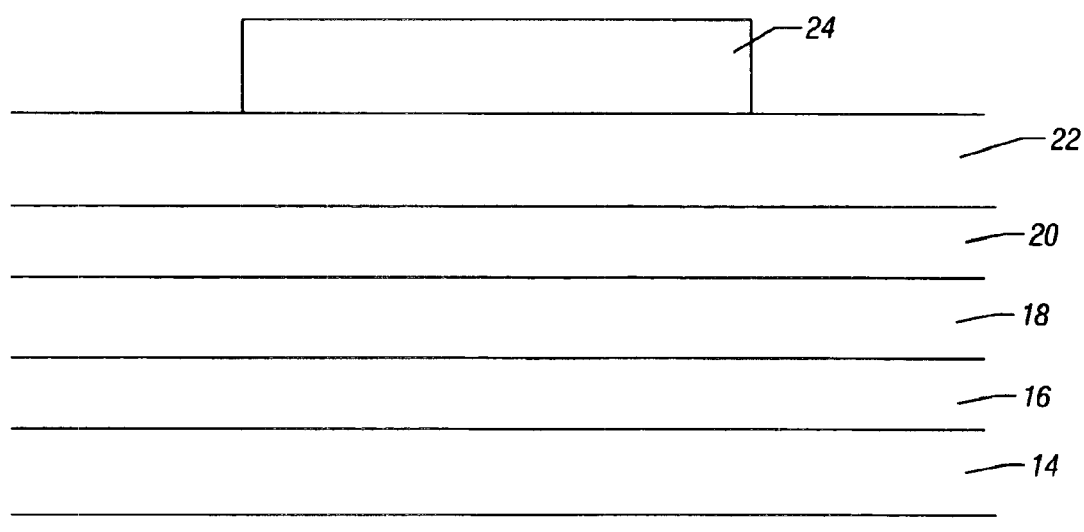
FIG. 3 is a cross-sectional view of the embodiment depicted in FIG. 2 after subsequent processing.

The lower electrode 22 may be deposited over the region 20 as depicted in FIG. 3. A mask 24, which may be made of photoresist, may be patterned over each electrode 22 on the substrate 12 to form circular patches, in some embodiments. The structure, shown in FIG. 3, may be isotropically etched. Mask and etch parameters are selected so that the vertical and lateral etch rates are sufficient to cut through layers 16, 18 and 20 and achieve a taper on the electrode 22. The deposition of the lower electrode 22 may also simultaneously form the lower electrodes 22 of a number of surrounding memory cells (not shown) without the need to mask off the electrodes 22 for each cell.

Figure 4:
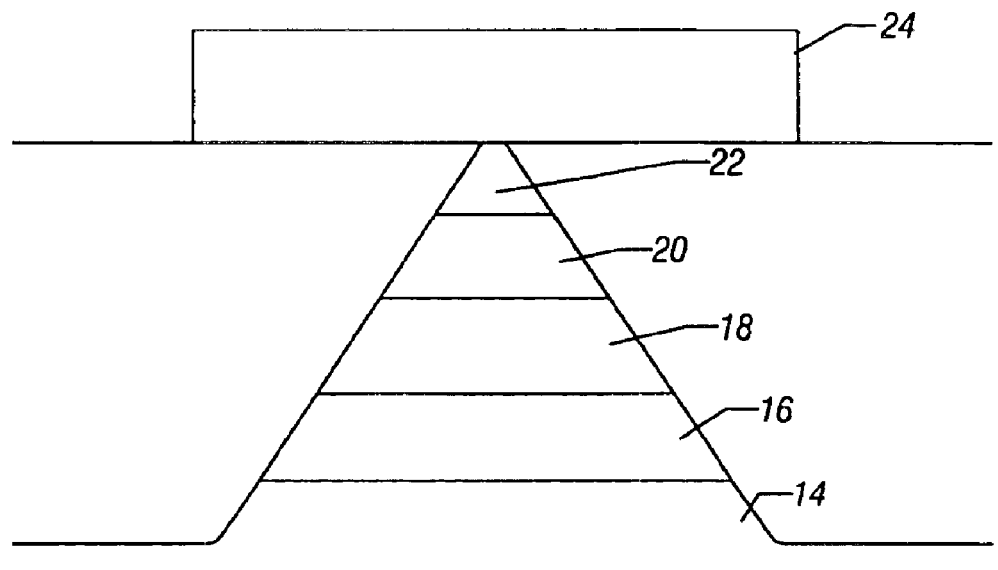
FIG. 4 is a cross-sectional view of the embodiment depicted in FIG. 3 after further processing.

The substrate portion 12b is conically shaped as a result of the etching as shown in FIG. 4. The etched dimension of the lower electrode 22 may be smaller than that of the mask 24 due to undercutting. The isotropic etching also separates the electrodes 22 of each memory cell 10 from the electrodes 22 of surrounding cells. The mask 24 may be subsequently removed, for example by ashing, to expose the lower electrode 22.

In some embodiments, the size of the closed region of mask 24 may be the minimum feature size attainable. Other methods to reduce the area of the upper surface of the lower electrode 22 may include reactive means such as oxidation.

Figure 5:
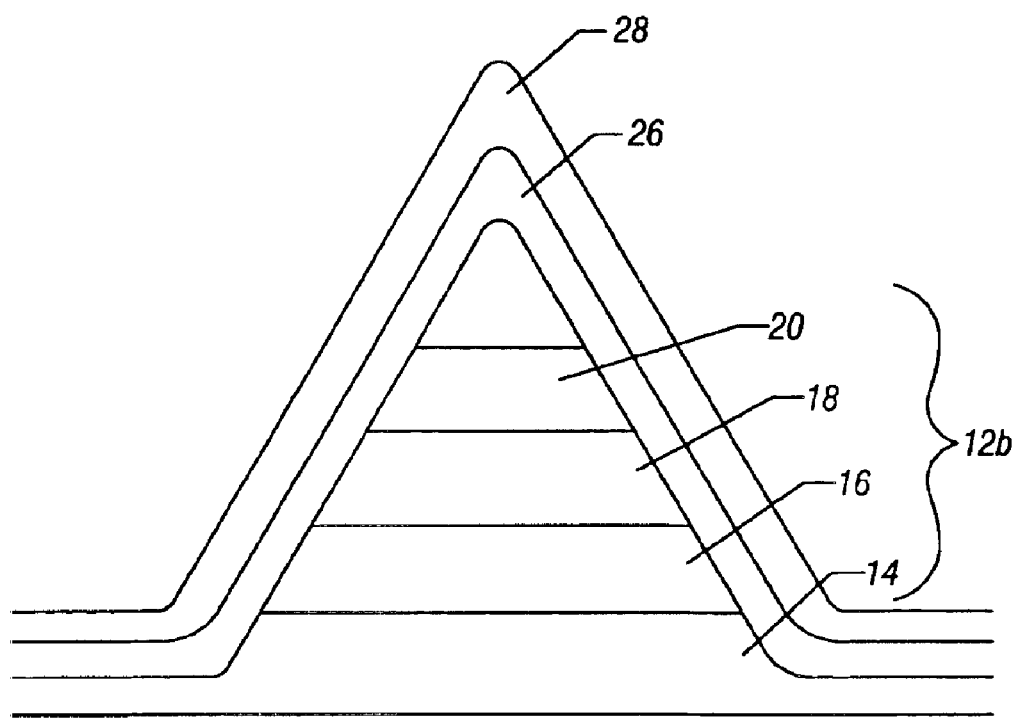
FIG. 5 shows subsequent processing on the structure shown in FIG. 4 in accordance with one embodiment of the present invention.

The conical substrate portion 12b may be covered with dielectric layers 26 and 28 as shown in FIG. 5. A process such as low-pressure chemical vapor deposition (LPCVD) may be used to deposit each material. Again, the portions 12b of a large number of surrounding memory cells (not shown) may be covered in the same blanket deposition without masking between the cells.

Figure 6:
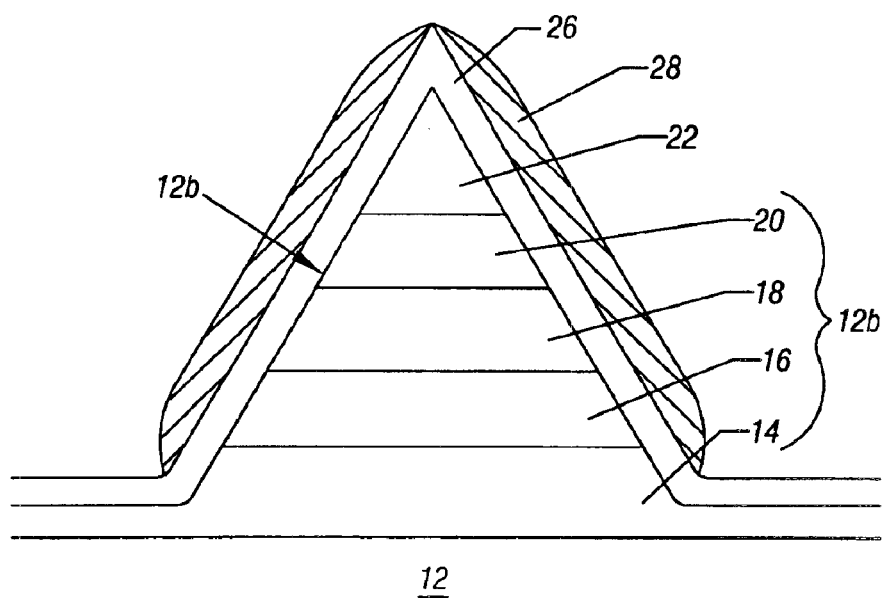
FIG. 6 shows subsequent processing on the structure shown in FIG. 5, in accordance with one embodiment of the present invention.

Subsequently the dielectric layer 28 may be etched selectively with respect to the dielectric layer 26 by any anisotropic means such as reactive ion etching. The residual dielectric region 28 over the conical substrate portion 12b is removed from horizontal surfaces as a result of anisotropic etching as shown in FIG. 6.

Figure 7:
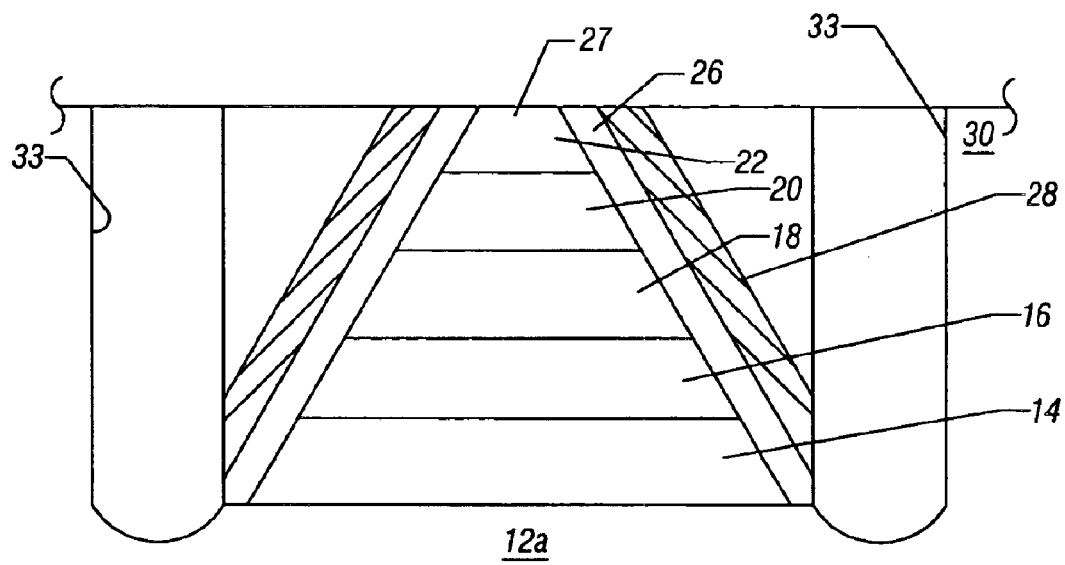
FIG. 7 shows subsequent processing on the structure shown in FIG. 6 in accordance with one embodiment of the present invention.

Further, the conical substrate portion 12b may be covered with an insulator 30, as shown in FIG. 7. This insulator 30 is chemically distinct from dielectric layer 28 and, in some embodiments, may be high-density plasma (HDP) oxide. Planarization of the insulator 30, for example, by chemical mechanical planarization (CMP) may expose (and perhaps flatten) the tip 27 of the lower electrode 22.

A pair of spaced trenches 33, electrically isolating a wordline of cells 10 from adjacent wordlines, may be etched through the insulator 30 on either side of the memory cell 10 using suitable patterning and etching methods. In particular, the etch parameters are selected to etch the insulator 30 selectively with respect to the dielectric region 28.

In regions of slight mask misalignment, the dielectric layer 28 reduces the etching of the conical substrate portion 12b confining the etch to the region between adjacent wordlines. Thus, the dielectric layers 26 and 28 enable the etching of the trenches 33 in close proximity to the conical substrate portion 12b of surrounding memory cells 10 without the need for a critical mask alignment.

The etched trenches 33 extend into the lower substrate portion 12a to electrically isolate the wordline of cells 10. The cells in each wordline may be simultaneously severed from adjacent wordlines by severing the connection that remains via the layer 14. Thus, a plurality of wordlines may be electrically isolated by the same self-aligned trench isolation step.

Figure 8:
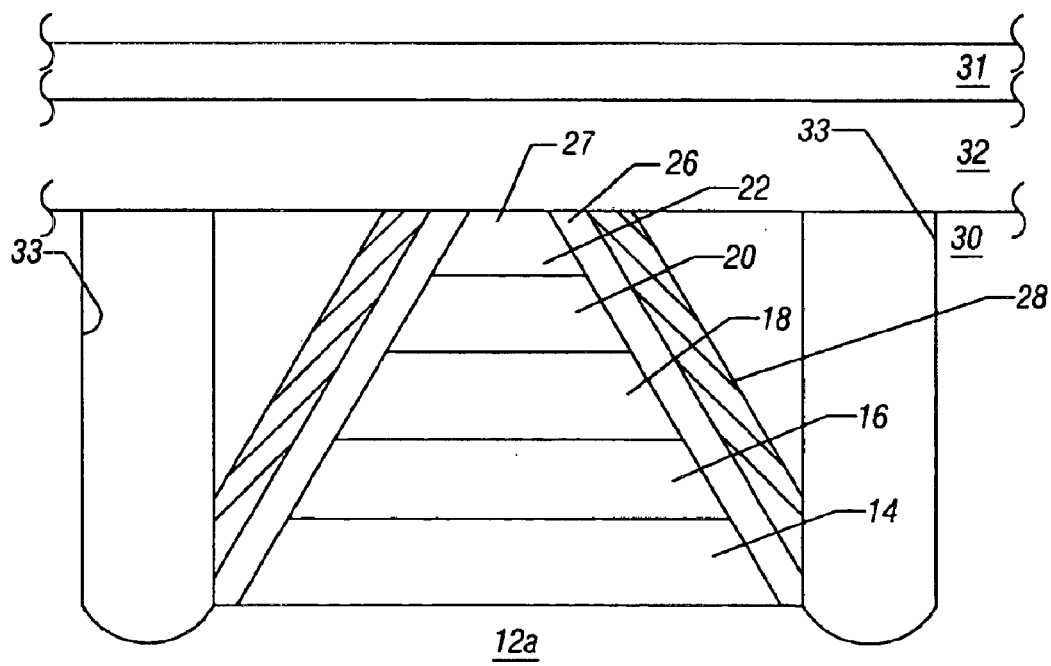
FIG. 8 is an enlarged, cross-sectional view of the structure shown in FIG. 7 after additional processing in accordance with one embodiment of the present invention.

Referring to FIG. 8, the phase-change material 32 may be deposited over the lower electrode 22 and the insulator 30. A suitable conductive region may be deposited over the deposited lower electrode 22 to form the upper electrode 31 by patterning and etching the phase-change material 32/lower electrode 22 stack.

The memory cell 10 shown in FIG. 1 may be replicated to form a memory array containing many cells. Such memory arrays can be used as the memory of a wide variety of processor-based systems, such as system 40 in FIG. 9, or in processor-based appliances.

Figure 9:
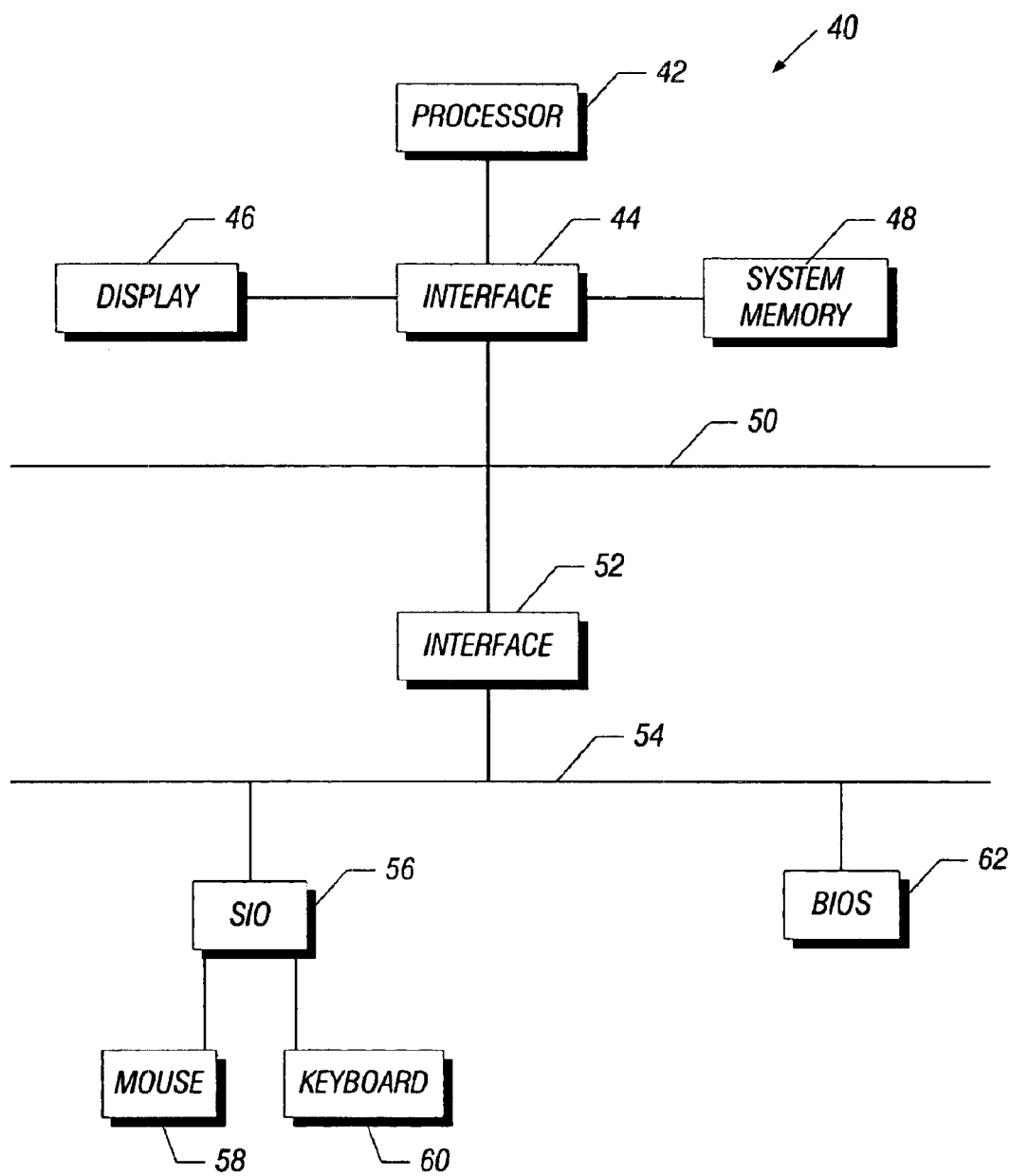
FIG. 9 is a schematic depiction of a processor-based system in accordance with one embodiment of the present invention.

FIG. 9 depicts one possible embodiment of a computer system 40 that might use a plurality of such memory cells, or memory array, in different configurations. The phase change memory 48 formed according to the principles described herein, may act as a system memory. The memory 48 may be coupled to an interface 44, for instance, which in turn is coupled between a processor 42, a display 46 and a bus 50. The bus 50 in such an embodiment is coupled to an interface 52 that in turn is coupled to another bus 54.

The bus 54 may be coupled to a basic input/output system (BIOS) memory 62 and to a serial input/output (SIO) device 56. The device 56 may be coupled to a mouse 58 and a keyboard 60, for example. Of course, the architecture shown in FIG. 9 is only an example of a potential architecture that may include the memory 48 using the phase-change material.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase-change memory cell comprising: a substrate; a plurality of layers of different doping levels in the substrate; a tapered lower electrode for the phase-change memory cell over the substrate; and a trench in said layers, on either side of said tapered electrode.

2. The memory of claim 1 including an insulator over said electrode.

3. The memory of claim 1 including a substrate under said tapered electrode, said substrate including a lower portion and a tapered upper portion.

4. The memory of claim 3 wherein said insulator covers said tapered substrate portion.

5. The memory of claim 4 wherein said lower substrate portion is free of said insulator.

6. The memory of claim 2 wherein said trenches are self-aligned to said tapered electrode.

7. The memory of claim 2 wherein said tapered electrode is conical.

8. The memory of claim 3 wherein said tapered substrate portion includes a first region of a first conductivity type over a second region of a second conductivity type.

9. The memory of claim 8 wherein said first type is P type and said first region is sandwiched between said second region and said electrode.

10. The memory of claim 9 including a buried wordline formed in said upper portion.

* * * * *